United States Patent [19]

Hsu et al.

[11] Patent Number: 5,552,331
[45] Date of Patent: Sep. 3, 1996

[54] PROCESS FOR SELF-ALIGNED SOURCE FOR HIGH DENSITY MEMORY

[75] Inventors: James J. Hsu, Saratoga; Steven W. Longcor, Mountain View, both of Calif.

[73] Assignee: Advanced Micro Devices, Inc., Sunnyvale, Calif.

[21] Appl. No.: 500,648

[22] Filed: Jul. 11, 1995

[51] Int. Cl.$^6$ ................................................. H01L 21/265
[52] U.S. Cl. ........................... 437/40; 437/41; 437/43; 437/48; 437/52
[58] Field of Search ..................... 437/52, 48, 43, 437/40 SW, 41 SW, 40 AS, 41 AS, 41 RMM

[56] References Cited

U.S. PATENT DOCUMENTS

| | | | |
|---|---|---|---|
| 5,147,813 | 9/1992 | Woo | 437/52 |
| 5,200,350 | 4/1993 | Gill et al. | 437/43 |
| 5,439,835 | 8/1995 | Gonzales | 437/52 |

Primary Examiner—Tuan H. Nguyen
Attorney, Agent, or Firm—Skjerven, Morrill, MacPherson, Franklin & Friel; Paul J. Winters

[57] ABSTRACT

An improved method for protecting the gate edge and adjacent source region of a semiconductor device is disclosed. In this method, spacers are formed along the gates of one type of transistor to protect the gate edge and adjacent source area during a self-aligned source etch. Spacers of a different width, which may be optimized for different voltage requirements, are formed along the gates of a second type of transistor of the same intergated circuit. This method is particularly applicable in the formation of EPROM, Flash EPROM, EEPROM, or other memory cells in conjunction with periphery devices needing to sustain relatively higher voltages. By decouplng the memory cell requirement from the periphery device requirement, tighter gate spacing and smaller cell size can be achieved.

20 Claims, 7 Drawing Sheets

PROCESS FOR SELF-ALIGNED SOURCE FOR HIGH DENSITY MEMORY

FIELD OF THE INVENTION

This invention relates to semiconductor devices, and more particularly, to a semiconductor structure which combines memory cells with remote periphery transistors.

BACKGROUND OF THE INVENTION

Figure 1:
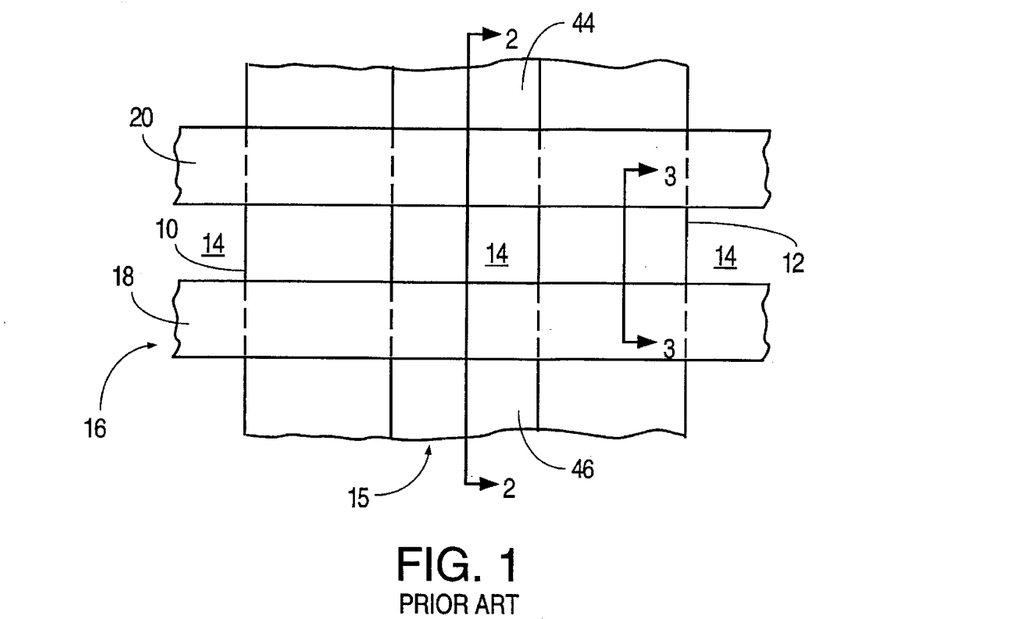
FIG. 1 is a plan view of a typical flash memory structure of the prior art.
Figure 2:
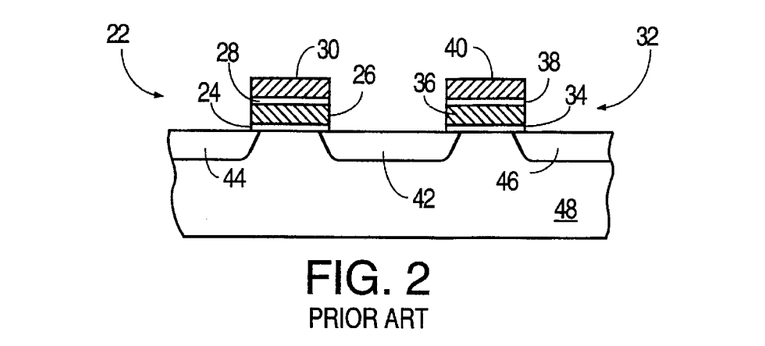
FIG. 2 is a sectional view taken along the line 2—2 of FIG. 1.
Figure 3:
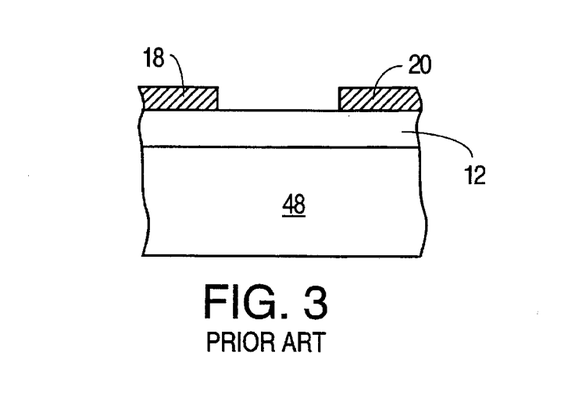
FIG. 3 is a sectional view taken along the line 3—3 of FIG. 1.

FIGS. 1–3, related to U.S. Pat. No. 5,120,671 to Tang et al., issued Jun. 9, 1992, show high density self-aligned-source flash memory cells fabricated by using a conventional process. FIG. 1 is a plan view of a portion of a memory device formed in that manner. Field oxide regions 10, 12 are formed as continuous lines across the source line 14 in the substrate 15. Using conventional techniques, a gate oxide layer is formed on the substrate areas between field oxide lines, followed by deposition and patterning of a first polysilicon layer, and formation of an intergate dielectric layer. A second layer of polysilicon 16 is deposited and, after appropriate masking, exposed portions of the polysilicon are etched away forming control gate regions 18, 20 (word lines). At this point, appropriate etching steps are used to remove intergate dielectric and first polysilicon exposed between word lines. A photoresist mask exposing the source regions is then applied over the device. Exposed field oxide regions 10, 12 are etched away using an oxide etch process selective to silicon, forming a source line connecting source regions 14. This continuous source line is parallel to and self-aligned to the edges of the previously defined word lines.

FIGS. 2 and 3 are sectional views taken along the lines 2—2 and 3—3 of FIG. 1 respectively, prior to the etching of the field oxide regions 10, 12. FIG. 2 shows a first stack 22 made up of gate oxide 24-floating gate 26-intergate dielectric 28-control gate 30, and a second stack 32 made up of gate oxide 34-floating gate 36-intergate dielectric 38-control gate 40 with source 42 and drains 44, 46 in the substrate 48 self-aligned to the edges of the control gates 30, 40. The word lines 18, 20 define the control gates 30, 40 respectively and extend over the field oxide regions such as regions 10, 12 (FIG. 3).

During the etching of field oxide regions 10, 12, it is inevitable that etchant reaches the silicon substrate 48 and causes gouging thereof in the regions between stacks 30, 40. Such gouging affects the formation of the source junction 42 causing the erase function to slow down, and can cause the erase distribution to be widened due to nonuniformity of such gouging from transistor to transistor.

In order to overcome the above-cited problem, the process as shown in FIGS. 4 through 9 has been used. (FIG. 4 includes sectional views 4a, 4b, and 4c, FIGS. 4a and 4b corresponding to the sectional views of FIGS. 2 and 3, while FIG. 4c is a sectional view of a periphery transistor in the same intergated circuit. FIGS. 5–9 follow the same convention, as do FIGS. 10–14).

Figure 4A:
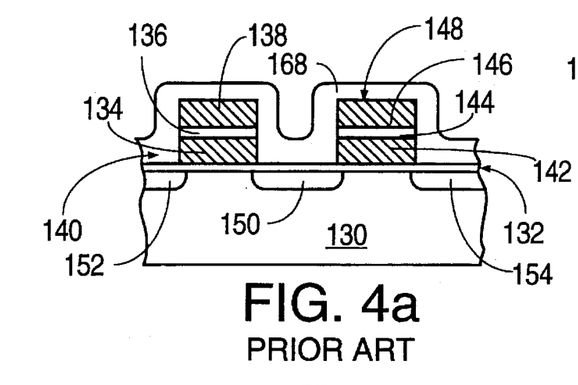
FIGS. 4a–4c, 5a–5c, 6a–6c, 7a–7c, 8a–8c, 9a–9c are a series of cross sectional views showing the process flow of another flash memory system.
Figure 4B:
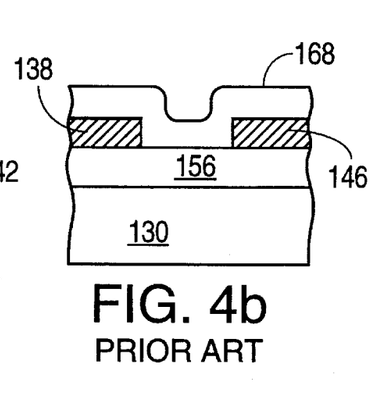

As shown in FIG. 4a, a silicon substrate 130 is provided with a gate oxide 132 formed thereover. A first floating gate 134-intergate dielectric 136-control gate 138 stack 140 is provided on the oxide layer 132, and a second floating gate 142-intergate dielectric 144-control gate 146 stack 148 is also provided on the oxide layer 132, spaced from the stack 140. A source region 150 is provided in the substrate 130, self-aligned to the adjacent edges of the stacks 140, 148. Drain regions 152, 154 are also included in the substrate 130, self-aligned to the respective opposite edges of the stacks 140, 148. The control gates 138, 146 extend over field oxide 156 (FIG. 4b), which in turn lies over substrate 130. Remote from the structure of FIGS. 4a and 4b is a high voltage periphery transistor 158 (FIG. 4c) including a gate oxide 160 on the substrate 130, and a gate 162, with lightly-doped source and drain regions 164, 166 being self-aligned to the edges of the gate 162.

Figure 4C:
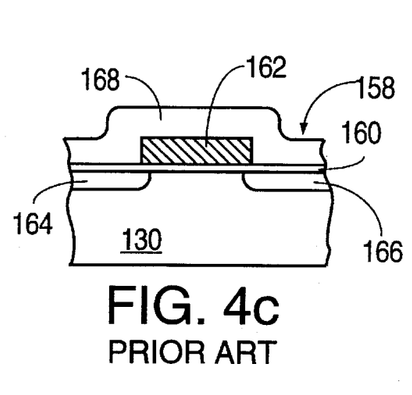

Over this structure is deposited a thick (for example 3000 Å) layer of oxide 168. This deposited oxide 168 is then anisotropically etched to form relatively wide spacers 170, 172, 174, 176 on the sides of each stack 140, 148, relatively wide spacers 178, 180 on the adjacent sides of the control gates 138, 146 over the field oxide 156, and relatively wide spacers 182, 184 on the sides of the gate 162 of the high voltage periphery transistor 158. The relatively wide spacers 182, 184 on the sides of the gate 162 of the high voltage periphery transistor 158 are properly configured so that subsequently-formed heavily doped source and drain regions will be self-aligned to the spacers 182, 184 and properly positioned in relation to the lightly doped source and drain regions 164, 166. Such wide spacers 182, 184 are necessary to meet high transistor junction breakdown requirements. However, provision of such relatively wide spacers 178, 180 on the inner sides of the control gates 138, 140 over the field oxide 156 causes certain problems, as will now be described.

Figure 5A:
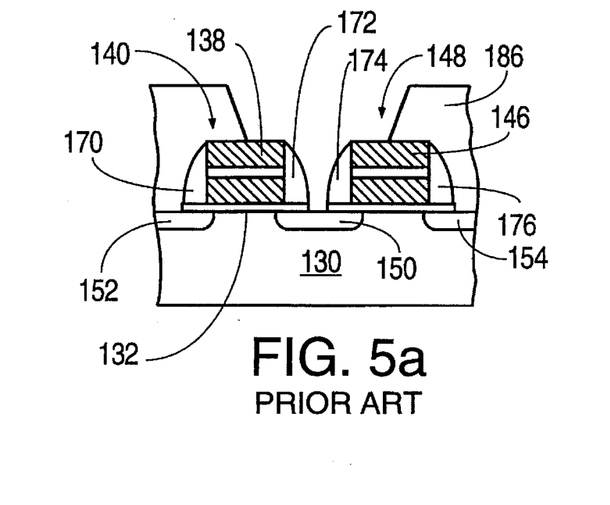
Figure 5B:
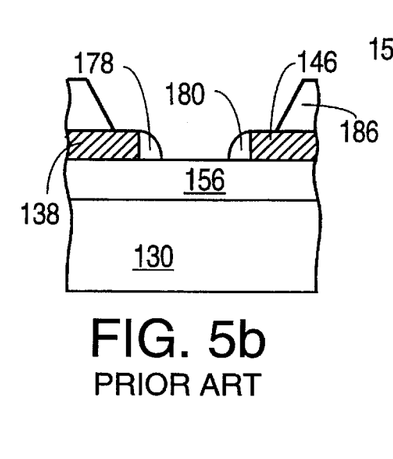
Figure 5C:
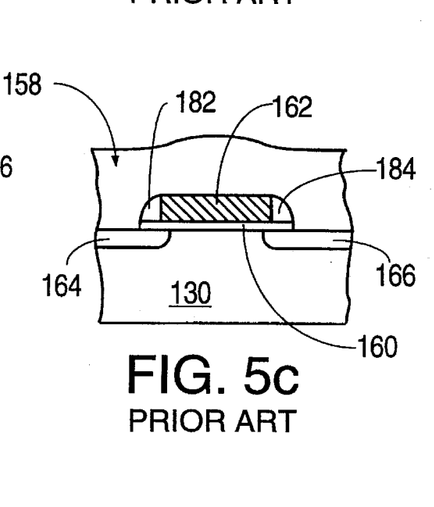

As noted in FIG. 5, masking 186 is provided over appropriate areas of the structure, and further anisotropic etching is undertaken. Such etching is undertaken through the thin oxide layer 132 (FIG. 6a), and also through the field oxide 156 (FIG. 6b), it being noted that the exposed width (dimension X) of the silicon 130 due to etching through of the field oxide 156 is relatively small, because of the initial large width of the spacers 178, 180. In the meantime, etchant cannot reach the high-voltage periphery transistor 158 due to masking 186 thereover.

Then, after removal of the masking 186, a thin layer of oxide 188 is grown over the exposed portion of the silicon 130 between the stacks 140, 148, and a thin layer of oxide 190 is grown over the exposed portion of the silicon 130 provided by the opening in the field oxide 156 (FIG. 7b) simultaneously forming thin oxide layers 188, 190 and 191.

Figure 9A:
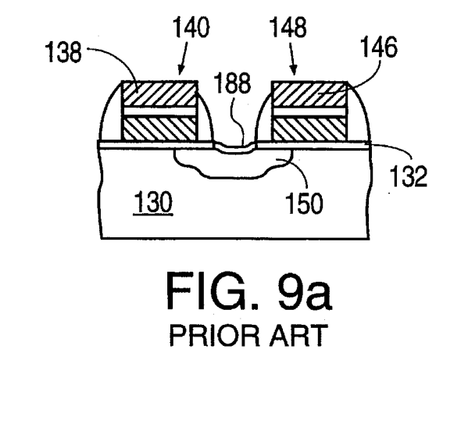
Figure 9B:
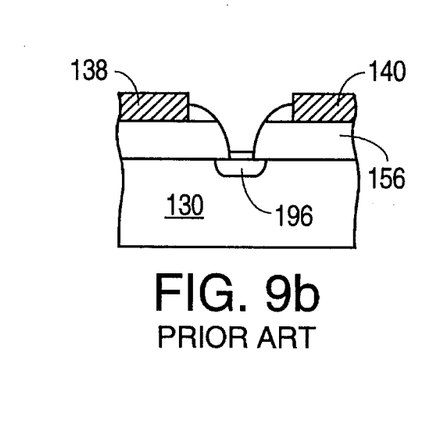
Figure 9C:
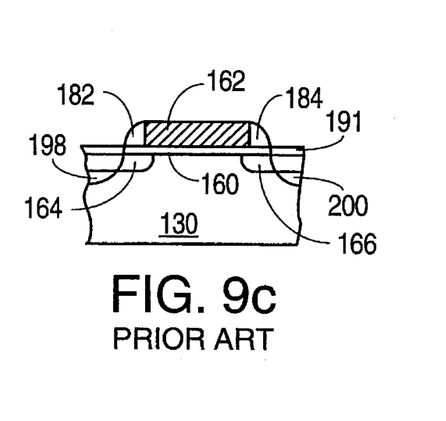

After further masking 192 (FIG. 8), ion implantation 194 is undertaken through the grown thin layers of oxide 188, 190, and a diffusion step is undertaken so that the source region 150 takes the shape shown in FIG. 9a, and the diffused area 196 adjacent the field oxide (FIG. 9b) provides connection between the source region 150 and other source regions. Further processing steps are then provided to form heavily doped source and drain regions 198, 200 of the periphery transistor 158, self aligned to the spacers 182, 184.

Figure 6A:
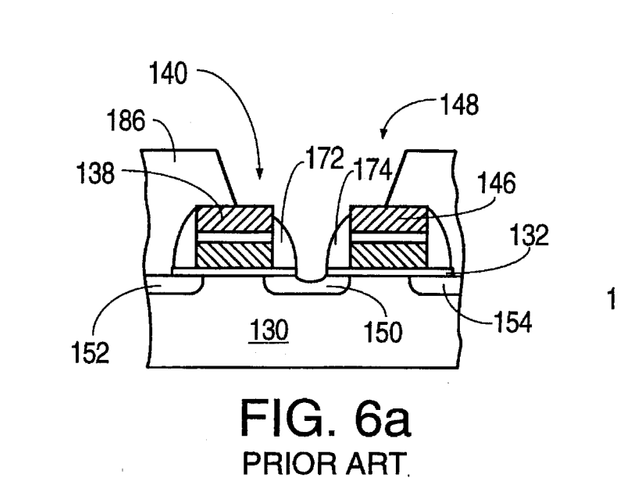
Figure 6B:
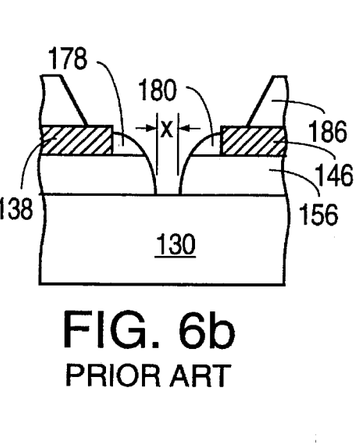
Figure 6C:
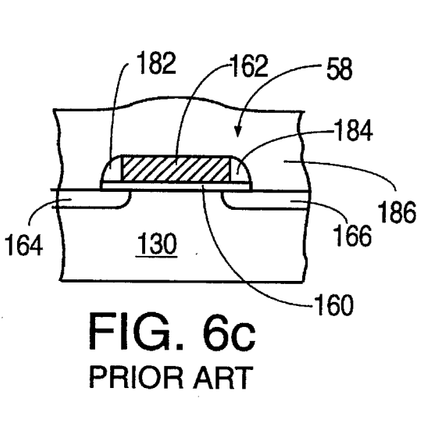
Figure 7A:
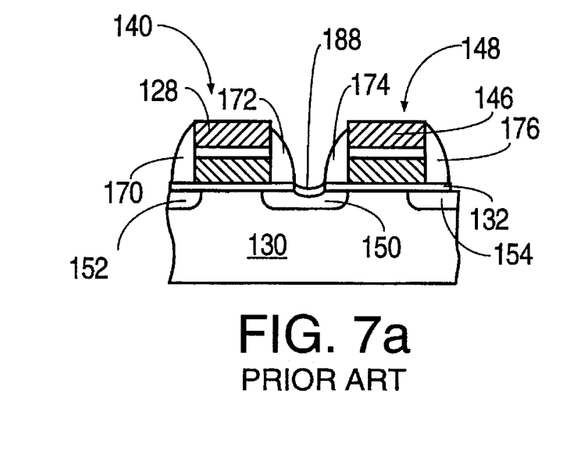
Figure 7B:
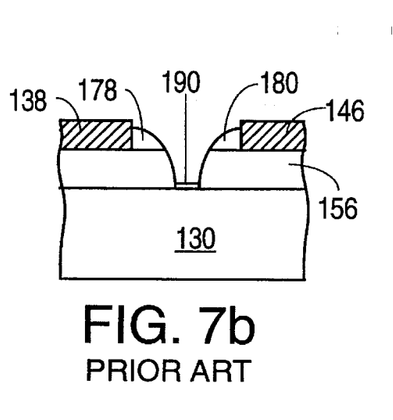
Figure 7C:
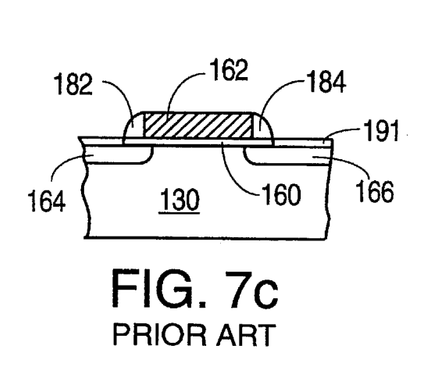
Figure 8A:
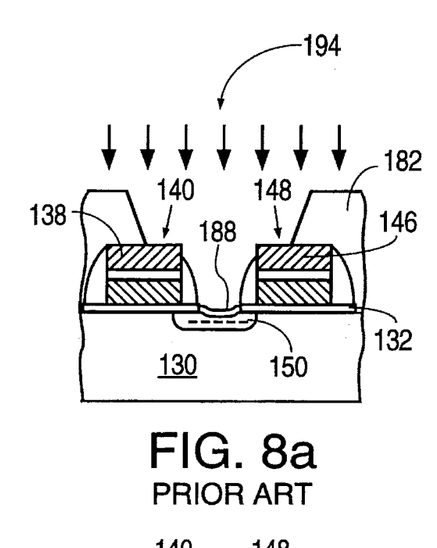
Figure 8B:
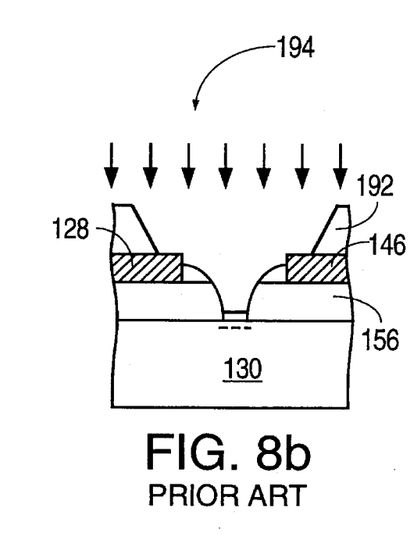
Figure 8C:
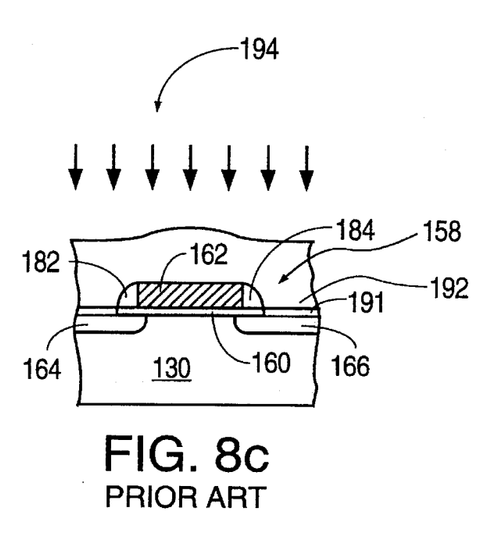

This method, because of inclusion of spacers 170, 172, 174, 176, avoids the gouging problem at the gate edges described above with regard to FIG. 1. However, with the very small dimension X as shown at FIG. 6b, the narrow connecting region results in high series resistance between devices.

In addition, it should be noted that for the process described, two masking steps are involved. It will be understood that is always desirable to decrease the number of masking steps in a process, so as to improve manufacturing efficiency.

SUMMARY OF THE INVENTION

The present invention overcomes the above-cited problems by initially forming flash memory transistor source and drain junctions and then providing a relatively thin layer of deposited oxide over floating gate-intergate dielectric-control gate stacks of flash memory transistors, over the control gate extensions on field oxide, and over the gate oxide and gate of a high voltage periphery transistor. After appropriate masking, this deposited thin oxide is etched to provide relatively narrow spacers on the adjacent sides of the stack, and on the adjacent sides of the control gate over the field oxide. The field oxide is subsequently etched through while source junctions are protected by the spacers on adjacent sides of the stacks. The deposited thin oxide over the periphery transistor is blocked by masking at this point. Then, after growing thin oxide over the exposed regions of the silicon between the stacks and the silicon regions exposed by etching through the field oxide, implantation (without resist mask) and diffusion are undertaken to form the interconnect between the source regions of adjacent devices. The deposited thin oxide is used as an implant blocking mask, thus saving one photoresist masking step in the process. Because the spacers are relatively narrow, the portion of silicon exposed by etching through the field oxide is relatively wide so that a relatively large width of silicon is exposed to implant, so that low series resistance between the sources of devices is provided.

Then, another layer of oxide is deposited over the resulting structure, including the periphery transistor, and upon etching, the preferred relatively wide spacers are provided on the opposite sides of the gate of the periphery transistor, so that the heavily doped source and drain regions of the periphery transistor are self-aligned to the edges of those wide spacers to render high junction breakdown for the periphery transistor.

DESCRIPTION OF THE PREFERRED EMBODIMENT

Figure 10A:
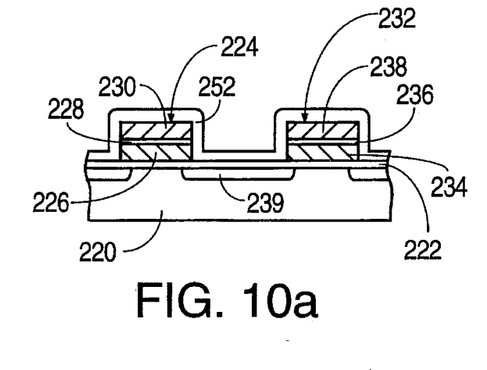
FIGS. 10a–10c, 11a–11c, 12a–12c, 13a–13c, 14a–14c are cross sectional views showing the process flow of the present invention.
Figure 10B:
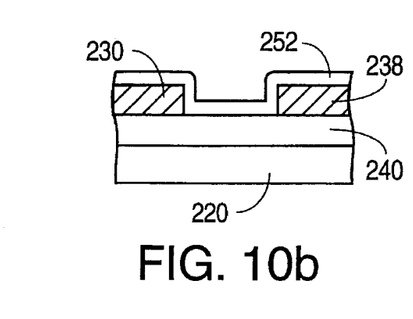
Figure 10C:
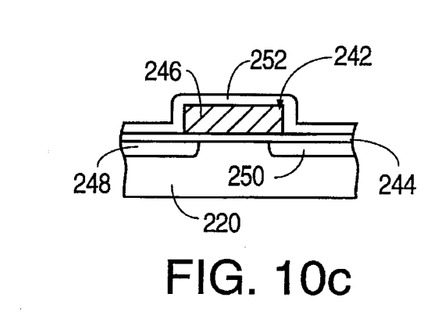

With reference to the drawings, FIG. 10 illustrates sectional views of several areas of a partially processed flash EPROM memory device. FIG. 10a shows a pair of transistors as thus far formed, including a semiconductor substrate 220 of for example p-type silicon on which is provided a gate oxide 222, a first stack 224 (including a floating gate 226 on the gate oxide 222, an intergate dielectric layer 228, and a control gate 230), and a second stack 232 (including a floating gate 234 on the gate oxide 222, an intergate dielectric layer 236 and a control gate 238). An n-type source region 239 is provided in the substrate 220, self-aligned to the adjacent edges of the respective stacks 224, 232.

FIG. 10b shows the structure adjacent to the structure of FIG. 10a, with extensions of the control gates 230, 238 over the field oxide 240, which in turn lies over the substrate 220, while FIG. 10c shows a high voltage remote periphery transistor 242 in an area removed from the structures of FIG. 10a and 10b, and which includes a gate oxide 244 over the substrate 220, a gate 246, and lightly doped source and drain regions 248, 250 aligned to the edges of the gate 246.

A thin film layer 252 is deposited over the structure as shown in FIG. 10a, 10b and 10c. This thin film layer 252 may take the form of an oxide, nitride, polysilicon or a combination thereof, or any dielectric.

Figure 11A:
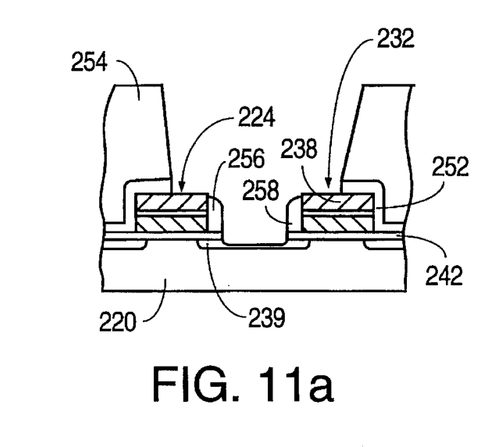
Figure 11B:
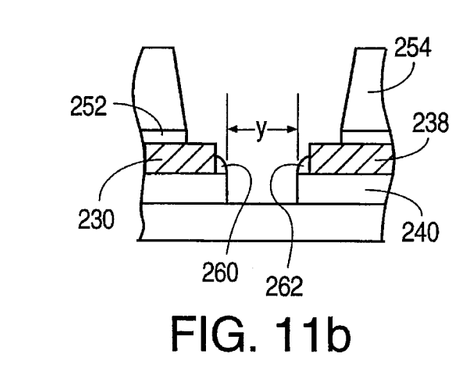
Figure 11C:
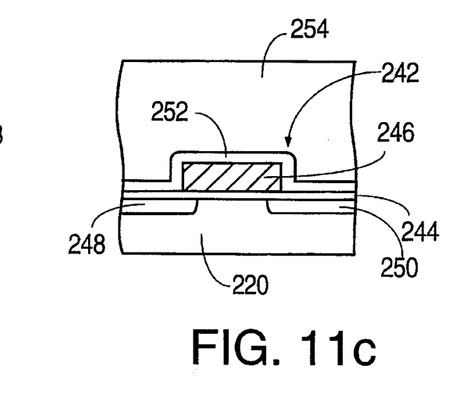

The resulting structure is appropriately masked (254) as shown in FIG. 11, and is anisotropically etched to provide relatively narrow spacers 256, 258 on the adjacent sides of the respect stacks 224, 232, and relatively narrow spacers 260, 262 on the adjacent sides of the control gates 230, 238 over the field oxide 240. The etching is continued through the layer of oxide 222 and into the substrate 220, and also through the field oxide 240 down to the substrate 220. Meanwhile, the periphery transistor 242 remains covered by a photoresist mask.

As noted, because of the relatively thin spacers 260, 262, the width Y (FIG. 11b) of exposed silicon caused by etching through the field oxide 240 is relatively large.

Figure 12A:
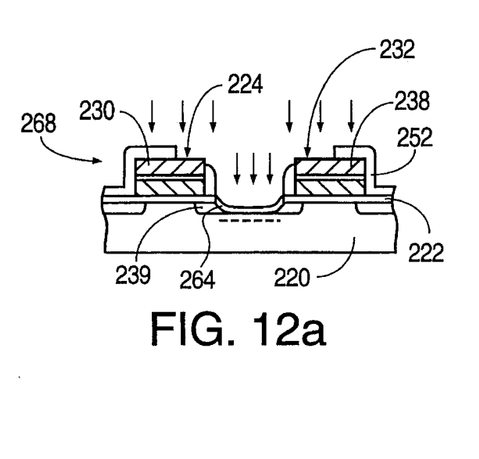
Figure 12B:
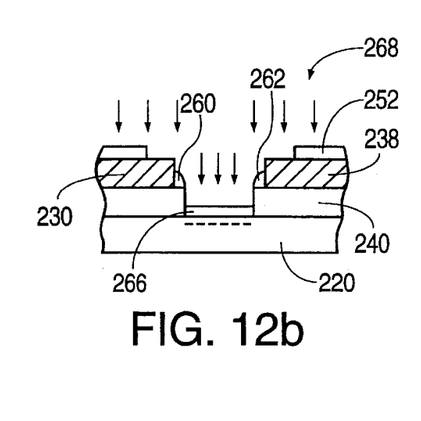
Figure 13A:
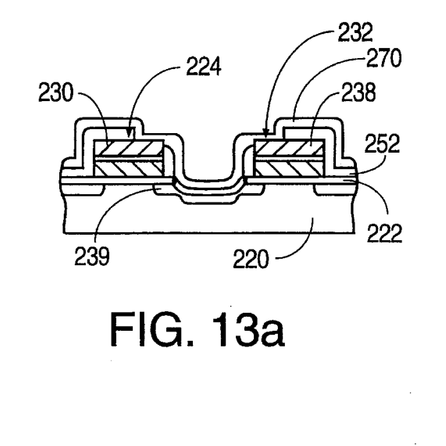

After removal of the masking 254, a thin layer of oxide is grown over the exposed silicon areas, at 264 and 266. Ion implantation 268 is then undertaken, self aligned to the spacers 256, 258 and spacers 260, 262, it being noted that because of the relatively thin spacers 256, 258, 260, 262, the implant covers a substantially wider area between the stacks 224, 232 and between the portions of field oxide 240 than in the prior art. It will then be seen that after diffusion of this implant (FIG. 13), the connection 269 between memory transistor sources is much wider than in the prior art, resulting in a much lower series resistance from source to source in the ultimately formed structure.

Figure 12C:
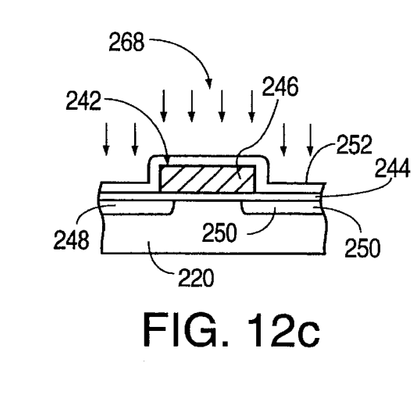

Meanwhile, thin film layer 252 blocks implant 268 from reaching the source and drain regions of periphery transistor 242 (FIG. 12c). Note that a resist masking step is not required to protect periphery transistors during this implant.

Figure 13B:
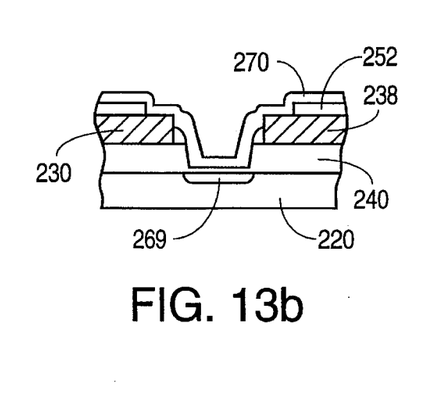
Figure 13C:
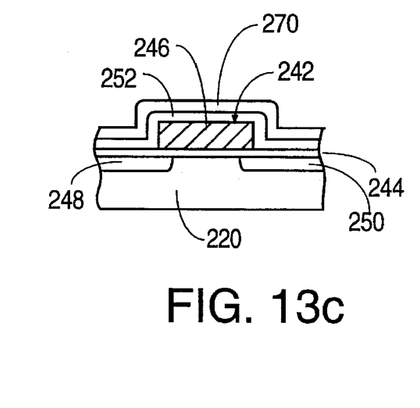

Then, with reference to FIG. 13, another thin film layer 270 of a chosen material as set forth above is deposited over the resulting structure, it being remembered that the thin film layer 252 as disposed over the high voltage periphery transistor 242 has been protected and is unchanged from the original deposit as shown in FIG. 10c. The thickness of layer 270 and layer 252 together approximately equals the thickness of layer 168 of the described prior art.

Figure 14A:
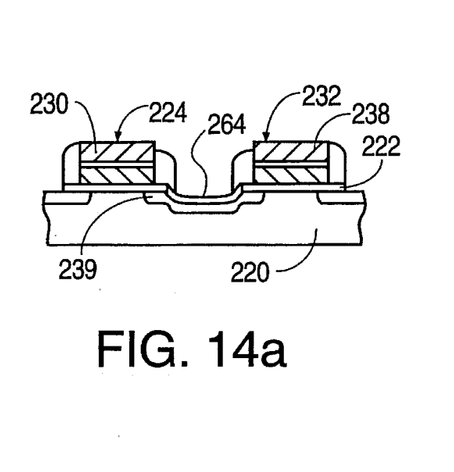
Figure 14B:
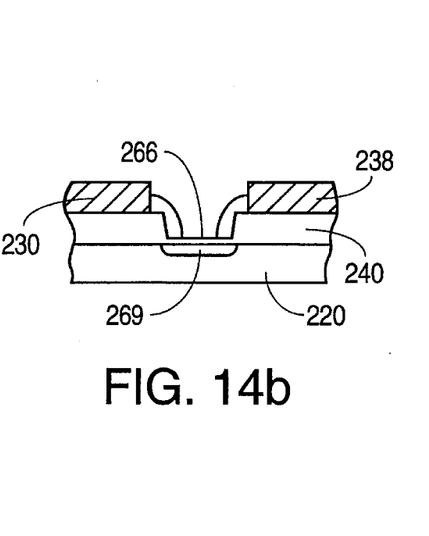
Figure 14C:
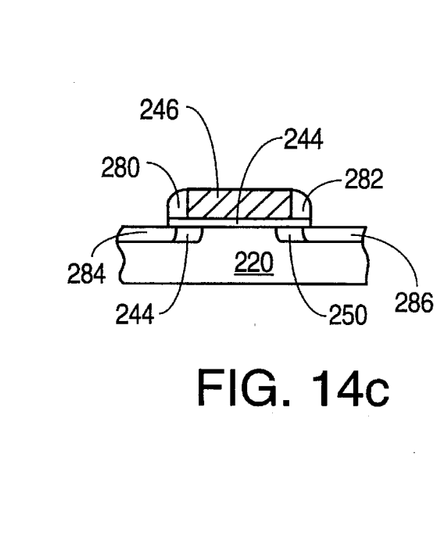

Another anisotropic etch is undertaken, resulting in relatively wide spacers 280, 282 on the opposite sides of the gate 246 of the transistor 242 so that the heavily doped regions 284, 286 subsequently formed can be properly self-aligned to the sides of those spacers 280, 282 and provide proper dimensioning in regard to the lightly doped regions 248, 250.

It will thus be noted that because of the increased width of the Vss connect, source series resistance is lower than in the prior art, and in addition only a single masking step is involved in these process steps as shown in FIGS. 10–14, as compared to two masking steps as shown in FIGS. 4–9.

In the foregoing specification, the preferred embodiment of present invention has been described in conjunction with a specific type of semiconductor device (Flash EPROM memory). It should be recognized by one of ordinary skill in the art that the process described can be applied to many other types of semiconductor devices. It should also be recognized that alternative materials and processes can be utilized for the dielectrics, gates, spacer films, etches, implants, and resist strips and they would be within the spirit and scope of the present invention.

The figures and description of the preferred embodiment are intended for the purposes of illustration. Many other modifications and variations are possible within the broader spirit and scope of the invention set forth in the appended claims.

We claim:

1. A method of fabricating a semiconductor structure including (i) a first transistor having a gate oxide on a semiconductor body and a gate structure including a control gate, (ii) a field oxide region on the semiconductor body adjacent the first transistor and having an extended portion of the control gate thereon, and (iii) a second transistor having a gate oxide on the semiconductor body and a gate on the gate oxide, comprising:

providing a first film layer over the thus-described structure;

anisotropically etching portions of the film layer to provide a first spacer on a side of the gate structure, and to provide a second spacer on a side of the extended portion of the control gate, said etching exposing a portion of the semiconductor body adjacent the first spacer, and, through the field oxide region, exposing a portion of the semiconductor body adjacent the extended portion of the control gate;

implanting ions into the semiconductor body;

providing a second film layer over the resulting structure; and anisotropically etching the resulting structure to provide a third spacer which is wider than the first and second spacers adjacent a side of the gate of the second transistor.

2. The method of claim 1 wherein the implantation of ions is self-aligned to the sides of the first and second spacers.

3. The method of claim 1 and further comprising the step of providing the film as dielectric.

4. The method of claim 3 and further comprising the step of providing the dielectric as oxide.

5. The method of claim 1 and further comprising the step of providing that the second transistor is a high-voltage transistor.

6. The method of claim 1 and further comprising the step of providing a source region in said semiconductor body adjacent said gate structure and prior to the step of forming said first and second spacers.

7. The method of claim 1 and further comprising the step of providing a drain region in said semiconductor body adjacent said gate structure and prior to the step of forming said first and second spacers.

8. The method of claim 1 and further comprising the step of providing a patterned mask subsequent to forming the first and second spacers, the mask being patterned to expose selected regions of the structure adjacent the first and second spacers as the field oxide is etched.

9. The method of claim 1 and further comprising the step of providing source and drain regions in the body adjacent to the gate of the second transistor prior to the step of forming the third spacer.

10. The method of claim 1 and further comprising the step of providing the gate structure of the first transistor as a floating gate-dielectric-control gate stack.

11. The method of claim 1 and further comprising the steps, prior to providing a second film layer over the resulting structure, of (i) growing an oxide layer on the exposed portion of the silicon body adjacent the first spacer and on the exposed portion of the silicon body adjacent the second spacer, and (ii) implanting ions through the grown oxide layer and into the semiconductor body.

12. A method of fabricating a semiconductor structure including (i) a pair of adjacent transistors each having a gate oxide on the semiconductor body and a gate structure including a control gate, the semiconductor body having a source region associated with the pair of transistors, (ii) a field oxide region on the semiconductor body adjacent the pair of transistors and having extended portions of the control gates of the pair of transistors thereon, and (iii) an additional transistor having a gate oxide on the semiconductor body and a gate on the gate oxide, comprising:

providing a first film layer over the above-described structure;

providing a patterned mask over the resulting structure to define openings through the mask to expose a portion of the first film layer between the pair of transistors and a portion of the film layer between the extended portions of the control gates;

anisotropically etching the exposed portions of the first film layer to provide a first pair of spacers, one and the other of the first pair of spacers being on the adjacent sides of the respective gate structures of the pair of transistors, and to provide a second pair of spacers, one and the other of the second pair of spacers being on adjacent sides of the respective extended portions of the control gates, said etching exposing a portion of the semiconductor body adjacent the source region and the first pair of spacers, and, through the field oxide, exposing a portion of the semiconductor body adjacent the extended portions of the control gates;

removing the patterned mask;

implanting ions into the semiconductor body, the implantation being self aligned to the sides of the respective spacers;

providing a second film layer over the resulting structure; and anisotropically etching the resulting structure to provide a third spacer which is wider the first and second spacers adjacent a side of the gate of the additional transistor.

13. The method of claim 12 and further comprising the step of providing the film as dielectric.

14. The method of claim 13 and further comprising the step of providing the dielectric as oxide.

15. A method of claim 12 and further comprising the step of providing that the third transistor is a high-voltage transistor.

16. The method of claim 12 and further comprising the step of providing a drain region in said semiconductor body adjacent said gate structure and prior to the step of forming said first and second spacers.

17. The method of claim 12 and further comprising the step of providing source and drain regions in the body adjacent to the gate of the second transistor prior to the step of forming the third spacer.

18. The method of claim 12 and further comprising the step of providing each of the gate structures of the pair of adjacent transistors as a floating gate-dielectric-control gate stack.

19. The method of claim 12 and further comprising the steps, prior to providing a second film layer over the resulting structure, of (i) growing an oxide layer on the exposed portion of the silicon body adjacent the first pair of spacers and on the exposed portion of the silicon body adjacent the second pair of spacers, and (ii) implanting ions through the grown oxide layer and into the semiconductor body.

20. The method of claim 12 and further comprising the step of providing that the film layer remains as an implant blocking mask over the additional transistor during implantation of ions into the semiconductor body.

* * * * *